United States Patent
Fan

(10) Patent No.: US 9,964,807 B2
(45) Date of Patent: May 8, 2018

(54) GRAPHENE BACKLIGHT MODULE AND LIQUID CRYSTAL DISPLAY

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 204 days.

(21) Appl. No.: 15/038,479

(22) PCT Filed: Apr. 8, 2016

(86) PCT No.: PCT/CN2016/078793
§ 371 (c)(1),
(2) Date: May 23, 2016

(87) PCT Pub. No.: WO2017/166331
PCT Pub. Date: Oct. 5, 2017

(65) Prior Publication Data
US 2018/0081241 A1 Mar. 22, 2018

(30) Foreign Application Priority Data
Mar. 28, 2016 (CN) .......................... 2016 1 0184662

(51) Int. Cl.
*G02F 1/1335* (2006.01)
*H01L 33/00* (2010.01)
(Continued)

(52) U.S. Cl.
CPC ...... *G02F 1/133621* (2013.01); *H01L 27/156* (2013.01); *H01L 33/0041* (2013.01);
(Continued)

(58) Field of Classification Search
CPC ...... H01M 4/625; H01M 4/583; H01M 4/133; H01M 4/1393; H01M 4/0404;
(Continued)

(56) References Cited

U.S. PATENT DOCUMENTS

2011/0309336 A1 12/2011 Shin et al.
2014/0231758 A1* 8/2014 Mok ................... H01L 51/5296
257/40
2017/0256679 A1 9/2017 Fan

FOREIGN PATENT DOCUMENTS

CN 203746858 U 7/2014
CN 204129385 U 1/2015
CN 105629576 A 6/2016

* cited by examiner

*Primary Examiner* — Thoi Duong
(74) *Attorney, Agent, or Firm* — Andrew C. Cheng

(57) ABSTRACT

The present disclosure proposes a graphene backlight module and an LCD. The graphene backlight module includes a first transparent substrate, a second transparent substrate, a graphene luminous layer, a protective layer, and a black matrix layer. The graphene luminous layer includes luminous elements. A gap located between any two of the adjacent luminous elements is covered by the protective layer. Each of the plurality of luminous elements comprises a source/drain layer, a luminous layer, and a gate layer covering the luminous layer. The black matrix layer includes a plurality of light-shielding units disposed on the protective layer which corresponds to the gap located between any two of the adjacent luminous elements. The graphene backlight module can reduce the color shift of the images shown on the LCD. The color saturation of wide-angle LCDs and the display effect of images are improved as well.

15 Claims, 1 Drawing Sheet

(51) Int. Cl.
   *H01L 27/15*   (2006.01)
   *H01L 33/40*   (2010.01)
   *H01L 33/54*   (2010.01)
   *H01L 33/60*   (2010.01)
   *H01L 33/26*   (2010.01)
   *G02F 1/1368*  (2006.01)

(52) U.S. Cl.
   CPC .............. *H01L 33/26* (2013.01); *H01L 33/40* (2013.01); *H01L 33/54* (2013.01); *H01L 33/60* (2013.01); *G02F 1/1368* (2013.01)

(58) Field of Classification Search
   CPC .... H01M 4/8673; H01M 4/139; H01M 4/134; H01M 4/96; H01M 2220/30; H01M 10/623; H01M 2/1022; H01M 8/0234; H01L 29/1606; H01L 21/02527; H01L 27/3262; H01L 27/3232; H01L 27/3211; H01L 27/322; H01L 51/5253; H01L 51/5206; H01L 51/5271; H01L 51/5012; H01L 51/502; H01L 33/26; C01B 32/158; C01B 32/20; C01B 32/182; C01B 2204/00; C01B 2204/02; C01B 2204/06; H01G 11/32; H01G 11/34; H01G 11/22; C04B 2235/422; C04B 2235/425; C04B 2235/5248; C04B 35/52; C04B 35/522; C09K 11/06; C09K 11/65; C09K 11/00; G02F 1/1333; G02F 1/1335; G02F 1/133514; G02F 1/133553; G02F 1/1336; G02F 1/133621; G02F 1/136286; G02F 2203/34; G02F 1/133602
   USPC ......... 423/448; 257/40; 429/231.8; 438/151, 438/22, 34, 46, 496; 349/65, 69, 71, 106, 349/61; 361/508, 611, 97.1, 97.2
   See application file for complete search history.

GRAPHENE BACKLIGHT MODULE AND LIQUID CRYSTAL DISPLAY

BACKGROUND OF THE INVENTION

1. Field of the Invention

The present invention relates to the field of field display, and more particularly, to a graphene display module and a liquid crystal display (LCD).

2. Description of the Prior Art

With the increasing development of liquid crystal display (LCD) technology, colorful LCDs are widely used in many devices. A backlight module acting as a key component of an LCD panel also plays a crucial role. The function of the backlight module is to supply the LCD with an enough amount of brightness and equally distributed light sources so that the LCD panel can show images normally.

The conventional backlight module usually comprises a light source, a light guide plate (LGP), an optical film, and a plastic frame. The thickness of the conventional backlight module is disadvantageous of designing a thinner and lighter backlight module. Besides, the LCD is vulnerable to luminous angles of the backlight module, resulting in color shift of displayed images.

SUMMARY OF THE INVENTION

An object of the present invention is to propose a graphene backlight module and an LCD to make it come true that a backlight module is thinner and lighter with improved color shift and better image display quality.

According to the present invention, a graphene backlight module comprises a first transparent substrate, a second transparent substrate, a graphene luminous layer, a protective layer, and a black matrix layer. The first transparent substrate and the second transparent substrate are opposite. The graphene luminous layer, the protective layer, and the black matrix layer are overlapped in layers between the first transparent substrate and the second transparent substrate. The graphene backlight module comprises a plurality of luminous elements. Three of the plurality of luminous elements form a luminous unit. A gap located between any two of the adjacent luminous elements is covered by the protective layer. Each of the plurality of luminous elements comprises a source/drain layer, a luminous layer, and a gate layer covering the luminous layer. The luminous layer covers the source/drain layer which comprises a source, a drain, and a channel between the source and the drain. The black matrix layer comprises a plurality of light-shielding units disposed on the protective layer which corresponds to the gap located between any two of the adjacent luminous elements.

Furthermore, the first transparent substrate is fabricated from water- and oxygen-resistant transparent organic material, glass, or nickel (Ni), and the second transparent substrate is fabricated from water- and oxygen-resistant transparent organic material or glass.

Furthermore, the source/drain layer is fabricated from reduced graphene oxide.

Furthermore, the luminous layer is fabricated from semi-reduced graphene oxide.

Furthermore, the gate layer is fabricated from semiconductor graphene oxide.

According to the present invention, a graphene backlight module comprises a first transparent substrate, a second transparent substrate, a graphene luminous layer, a protective layer, and a black matrix layer. The first transparent substrate and the second transparent substrate are opposite. The graphene luminous layer, the protective layer, and the black matrix layer are overlapped in layers between the first transparent substrate and the second transparent substrate. The graphene backlight module comprises a plurality of luminous elements. A gap located between any two of the adjacent luminous elements is covered by the protective layer. Each of the plurality of luminous elements comprises a source/drain layer, a luminous layer, and a gate layer covering the luminous layer. The luminous layer covers the source/drain layer which comprises a source, a drain, and a channel between the source and the drain. The black matrix layer comprises a plurality of light-shielding units disposed on the protective layer which corresponds to the gap located between any two of the adjacent luminous elements.

Furthermore, the backlight module further comprises a metallic reflector, and the metallic reflector being disposed on one side of the first transparent substrate away from the second transparent substrate.

Furthermore, the first transparent substrate is fabricated from water- and oxygen-resistant transparent organic material, glass, or nickel (Ni), and the second transparent substrate is fabricated from water- and oxygen-resistant transparent organic material or glass.

Furthermore, the source/drain layer is fabricated from reduced graphene oxide.

Furthermore, the luminous layer is fabricated from semi-reduced graphene oxide.

Furthermore, the gate layer is fabricated from semiconductor graphene oxide.

Furthermore, three of the plurality of luminous elements form a luminous unit.

According to the present invention, a liquid crystal display (LCD) comprises an LCD panel and a graphene backlight module as provided above. The graphene backlight module is arranged on the bottom of the LCD panel and is used for supplying the LCD with light sources.

Furthermore, the LCD panel comprises a first substrate, a second substrate, and a liquid crystal layer therebetween. The first substrate comprises a thin-film transistor (TFT) pixel electrode located close to the liquid crystal layer, the second substrate comprises a transparent color filter film located close to the liquid crystal layer, the liquid crystal layer comprises a plurality of spacers, each of the plurality of spacers being used for dividing the liquid crystal layer into a plurality of liquid crystal units; the plurality of liquid crystal units correspond to the luminous elements in the graphene backlight module.

Furthermore, a first polarizer is arranged on one side of the first substrate away from the liquid crystal layer, and a second polarizer is arranged on one side of the second substrate away from the liquid crystal layer.

In the present invention, neither LGPs nor optical films are used in the graphene backlight module used in the present invention. Also, highly bright and equally distributed backlight sources are supplied. Compared with the conventional technology, the backlight module presented by the present invention is thinner and lighter. The luminous layer of the graphene backlight module is fabricated from graphene so the full width at half maximum (FWHM) of the light emitted by the luminous element is smaller. The luminous angle is smaller so that smaller FWHM ensures color saturation of images. A luminous angle helps reduce color shift of LCDs comprising the graphene backlight modules efficiently, enhance color saturation of wide-angle LCDs, and improve the display effect of images.

DETAILED DESCRIPTION OF THE PREFERRED EMBODIMENTS

The specifications aim at readers' easy understanding with specific details on the structure of a specific system, the interface, and the technique instead of restrictions on the present invention.

Figure 1:
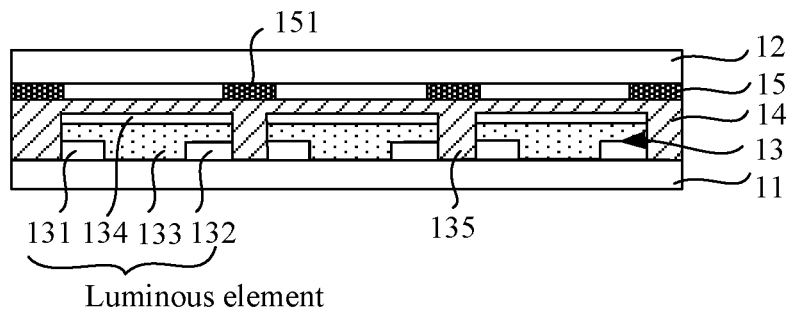
FIG. 1 is a cross-sectional view of a graphene backlight module according to one preferred embodiment of the present invention.

Please refer to FIG. 1. FIG. 1 is a cross-sectional view of a graphene backlight module 10 according to one preferred embodiment of the present invention. The graphene backlight module 10 comprises a first transparent substrate 11, a second transparent substrate 12, a graphene luminous layer 13, a protective layer 14, and a black matrix layer 15. The first transparent substrate 11 and the second transparent substrate 12 are opposite. The graphene luminous layer 13, the protective layer 14, and the black matrix layer 15 are overlapped in layers between the first transparent substrate 11 and the second transparent substrate 12.

The graphene luminous layer 13 is made of graphene. The graphene luminous layer 13 comprises a plurality of luminous elements. A gap 135 is located between any two of the adjacent luminous elements. The gap 135 is covered by the protective layer 14. Each of the plurality of luminous elements comprises a source/drain layer (The source/drain layer comprises a source 131, a drain 132, and a channel located between the source 131 and the drain 132), a luminous layer 133, and a gate layer 134.

The luminous layer 133 covers the source 131, the drain 132, and the channel between the source 131 and the drain 132. The source/drain layer comprises the source 131, the drain 132, and the channel. The gate 134 covers the luminous layer 133.

The color of the light emitted by the luminous element is adjusted by voltage imposed on the gate layer 134 in the luminous element. Voltage imposed on the drain 132 and the source 131 is altered to adjust the strength of the light.

For example, the source/drain voltage is Vds>Vth (threshold voltage), and the luminous element emits the red light when the voltage Vgs imposed the gate and the source is between zero volt and ten volts; the source/drain voltage is Vds>Vth (threshold voltage), and the luminous element emits the green light when the voltage Vgs imposed on the gate and the source is between twenty volts and thirty volts; the source/drain voltage is Vds>Vth (threshold voltage), and the luminous element emits the blue light when the voltage Vgs imposed the gate and the source is between forty volts and fifty volts.

The color and strength of the light emitted by the luminous element is adjusted in real time according to respective demands. The adjustment is dynamical.

Further, three serial luminous elements form a luminous unit, which corresponds to a red, green, and blue (RGB) color model. By modifying the voltage Vds imposed on the gate and the source in each of the plurality of luminous elements, the strength of the light with the RGB colors is adjusted for further adjusting grayscale.

The protective layer 14 is used for protecting the graphene luminous layer 13. The black matrix layer 15 is used for shielding light. The black matrix layer 15 comprises a plurality of light-shielding units 151. The plurality of light-shielding units 151 are disposed on the protective layer 14 which corresponds to the gap 135 located between any two of the adjacent luminous elements. The plurality of light-shielding units 151 at least covers the zone which the gap 135 on the protective layer 14 corresponds to for preventing the light emitted from the luminous element from leaking from the gap 135.

Preferably, the first transparent substrate 11 and/or the second transparent substrate 12 are/is a flexible transparent substrate.

Preferably, the first transparent substrate 11 is fabricated from water- and oxygen-resistant transparent organic material (such as polyethylene terephthalate, PET), glass, or nickel (Ni).

Preferably, the second transparent substrate 12 is fabricated from water- and oxygen-resistant transparent organic material (such as polyethylene terephthalate, PET) or glass.

Preferably, the source/drain layer (the source 131 and the drain 132) is fabricated from reduced graphene oxide.

Preferably, the luminous layer 133 is fabricated from semi-reduced graphene oxide.

Preferably, the gate layer 134 is fabricated from semiconductor graphene oxide.

In contrast to prior art, neither LGPs nor optical films are used in the graphene backlight module used in the present invention. Also, highly bright and equally distributed backlight sources are supplied. Compared with the conventional technology, the backlight module presented by the present invention is thinner and lighter. The luminous layer of the graphene backlight module is fabricated from graphene so the full width at half maximum (FWHM) of the light emitted by the luminous element is smaller. The luminous angle is smaller so that smaller FWHM ensures color saturation of images. A luminous angle helps reduce color shift of LCDs comprising the graphene backlight modules efficiently, enhance color saturation of wide-angle LCDs, and improve the display effect of images.

Figure 2:
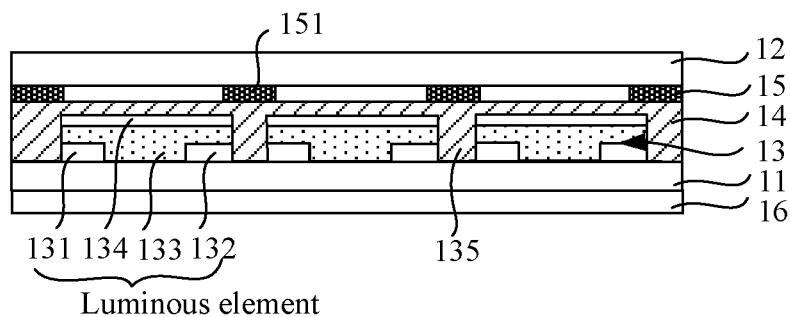
FIG. 2 is a cross-sectional view of a graphene backlight module according to another preferred embodiment of the present invention.

Please refer to FIG. 2. FIG. 2 is a cross-sectional view of a graphene backlight module 10 according to another preferred embodiment of the present invention. The graphene backlight module 10 further comprises a metallic reflector 16. The metallic reflector 16 is arranged on one side of a first transparent substrate 11 away from a second transparent substrate 12.

The metallic reflector 16 is used for reflecting the light emitted by the graphene luminous layer 13 for preventing the light emitted by the graphene luminous layer 13 from leaving from the bottom of the first transparent substrate 11. Instead, the reflected light is emitted out through the second transparent substrate 12, which is good for enhancing light efficiency (i.e., utilization of light) and the display brightness.

The wavelength of the light emitted by the graphene luminous layer 13 and then reflected by the metallic reflector 16 becomes shorter. Also, the luminous angle of the graphene backlight module 10 becomes smaller. It is beneficial for reducing the color shift of the LCD comprising the graphene backlight module 10, further enhancing the color saturation of wide-angle LCDs and improving the display effect of images.

The addition of the metallic reflector on the side of the first transparent substrate away from the second transparent substrate is good from improving the luminous efficiency and the display brightness. The reduction of the wavelength of the light reflected by the metallic reflector helps reduce the luminous angle of the graphene backlight module 10 and the color shift of images and improve the color saturation of wide-angle LCDs and the display effect of images.

Figure 3:
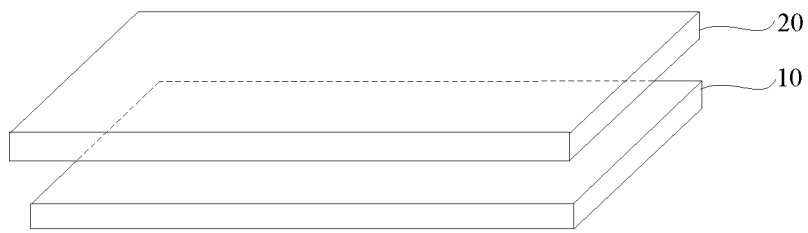
FIG. 3 is a schematic diagram of a liquid crystal display (LCD) according to one preferred embodiment of the present invention.

Please refer to FIG. 3. FIG. 3 is a schematic diagram of a liquid crystal display (LCD) according to one preferred embodiment of the present invention. The LCD comprises an LCD panel 20 and a graphene backlight module 10 laminated to the bottom of the LCD panel 20. The graphene backlight module 10 is used for supplying the LCD panel 20 with light sources.

The graphene backlight module 10 is what is described in any one of the above-mentioned embodiments of the present invention. The graphene backlight module 10 is detailed in these above-mentioned embodiments, so no more details are provided here.

Figure 4:
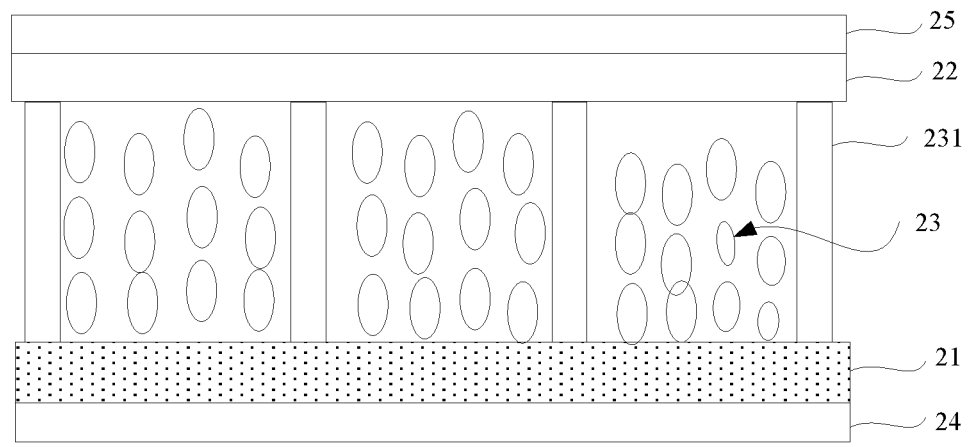
FIG. 4 is a cross-sectional view of a liquid crystal display (LCD) panel according to one preferred embodiment of the present invention.

Please refer to FIG. 4 as well. FIG. 4 is a cross-sectional view of a liquid crystal display (LCD) panel 20 according to one preferred embodiment of the present invention.

As FIG. 4 shows, the LCD panel 20 comprises a first substrate 21, a second substrate 22, and a liquid crystal layer 23. The first substrate 21 and the second substrate 22 are opposite. The liquid crystal layer 23 is inserted between the first substrate 21 and the second substrate 22.

The first substrate 21 comprises a thin-film transistor (TFT) pixel electrode (not shown) located close to the liquid crystal layer 23. The second substrate 22 comprises a transparent color filter film (not shown) located close to the liquid crystal layer 23. The materials for the transparent color filter film are not limited in this invention.

The liquid crystal layer 23 comprises a plurality of spacers 231. Each of the plurality of spacers 231 is used for dividing the liquid crystal layer 23 into a plurality of liquid crystal units. A liquid crystal unit corresponds to a luminous element in the graphene backlight module 10, which realizes multi-chromatic and sectional display.

A first polarizer 24 is arranged on one side of the first substrate 21 away from the liquid crystal layer 23. A second polarizer 25 is arranged on one side of the second substrate 22 away from the liquid crystal layer 23.

Compared with the conventional technology, neither LGPs nor optical films are used in the graphene backlight module 10 in this embodiment. A transparent color filter film used in the LCD panel is substituted for the conventional color filter film. The thickness of the LCD is effectively reduced.

The graphene backlight module 10 is disposed under the bottom of the LCD panel 20, so the light emitted by the graphene backlight module 10 has a smaller full width at half maximum (FWHM), which is good for enhancing color saturation. The graphene backlight module 10 has a smaller luminous angle, so the color shift of the images shown on the LCD is effectively reduced. The color saturation of wide-angle LCDs and the display effect of images are improved as well.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A graphene backlight module, comprising a first transparent substrate, a second transparent substrate, a graphene luminous layer, a protective layer, and a black matrix layer, the first transparent substrate and the second transparent substrate being opposite, and the graphene luminous layer, the protective layer, and the black matrix layer being overlapped in layers between the first transparent substrate and the second transparent substrate;
wherein the graphene backlight module comprises a plurality of luminous elements; three of the plurality of luminous elements form a luminous unit; a gap located between any two of the adjacent luminous elements is covered by the protective layer; each of the plurality of luminous elements comprises a source/drain layer, a luminous layer, and a gate layer covering the luminous layer; the luminous layer covers the source/drain layer which comprises a source, a drain, and a channel between the source and the drain;
the black matrix layer comprises a plurality of light-shielding units disposed on the protective layer which corresponds to the gap located between any two of the adjacent luminous elements.

2. The backlight module of claim 1, wherein the first transparent substrate is fabricated from water- and oxygen-resistant transparent organic material, glass, or nickel (Ni), and the second transparent substrate is fabricated from water- and oxygen-resistant transparent organic material or glass.

3. The backlight module of claim 2, wherein the source/drain layer is fabricated from reduced graphene oxide.

4. The backlight module of claim 2, wherein the luminous layer is fabricated from semi-reduced graphene oxide.

5. The backlight module of claim 2, wherein the gate layer is fabricated from semiconductor graphene oxide.

6. A graphene backlight module, comprising a first transparent substrate, a second transparent substrate, a graphene luminous layer, a protective layer, and a black matrix layer, the first transparent substrate and the second transparent substrate being opposite, and the graphene luminous layer, the protective layer, and the black matrix layer being overlapped in layers between the first transparent substrate and the second transparent substrate;
wherein the graphene backlight module comprises a plurality of luminous elements; a gap located between any two of the adjacent luminous elements is covered by the protective layer; each of the plurality of luminous elements comprises a source/drain layer, a luminous layer, and a gate layer covering the luminous layer; the luminous layer covers the source/drain layer which comprises a source, a drain, and a channel between the source and the drain;
the black matrix layer comprises a plurality of light-shielding units disposed on the protective layer which corresponds to the gap located between any two of the adjacent luminous elements.

7. The backlight module of claim 6, wherein the backlight module further comprises a metallic reflector, and the metallic reflector being disposed on one side of the first transparent substrate away from the second transparent substrate.

8. The backlight module of claim 6, wherein the first transparent substrate is fabricated from water- and oxygen-resistant transparent organic material, glass, or nickel (Ni), and the second transparent substrate is fabricated from water- and oxygen-resistant transparent organic material or glass.

9. The backlight module of claim 6, wherein the source/drain layer is fabricated from reduced graphene oxide.

10. The backlight module of claim 6, wherein the luminous layer is fabricated from semi-reduced graphene oxide.

11. The backlight module of claim 6, wherein the gate layer is fabricated from semiconductor graphene oxide.

12. The backlight module of claim 6, wherein three of the plurality of luminous elements form a luminous unit.

13. A liquid crystal display (LCD), comprising an LCD panel and a graphene backlight module of claim 6, the graphene backlight module arranged on the bottom of the LCD panel and used for supplying the LCD with light sources.

14. The LCD of claim 13, wherein the LCD panel comprises a first substrate, a second substrate, and a liquid crystal layer therebetween; the first substrate comprises a thin-film transistor (TFT) pixel electrode located close to the liquid crystal layer, the second substrate comprises a transparent color filter film located close to the liquid crystal layer, the liquid crystal layer comprises a plurality of spacers, each of the plurality of spacers being used for dividing the liquid crystal layer into a plurality of liquid crystal units; the plurality of liquid crystal units correspond to the luminous elements in the graphene backlight module.

15. The LCD of claim 14, wherein a first polarizer is arranged on one side of the first substrate away from the liquid crystal layer, and a second polarizer is arranged on one side of the second substrate away from the liquid crystal layer.

\* \* \* \* \*